United States Patent [19]

Venrooij et al.

[11] Patent Number: 5,297,897
[45] Date of Patent: Mar. 29, 1994

[54] SINGLE-STRIP MOLDING APPARATUS

[75] Inventors: Johannes L. G. M. Venrooij, KG Duiven; Wouter B. Verwoerd, RK Malden; Wilhelmus H. J. Harmsen, Al Wehl, all of Netherlands

[73] Assignee: ASM Fico Tooling B.V., Netherlands

[21] Appl. No.: 858,979

[22] PCT Filed: Nov. 23, 1990

[86] PCT No.: PCT/EP90/02032

§ 371 Date: May 20, 1992

§ 102(e) Date: May 20, 1992

[87] PCT Pub. No.: WO91/08095

PCT Pub. Date: Jun. 13, 1991

[30] Foreign Application Priority Data

Nov. 24, 1989 [EP] European Pat. Off. ........... 89203003
Dec. 7, 1989 [NL] Netherlands ........... 8903015

[51] Int. Cl.⁵ .................... B29C 45/02; B29C 45/42; B29C 45/76
[52] U.S. Cl. .................... 425/116; 425/121; 425/126.1; 425/149; 425/150; 425/226; 425/227; 425/436 RM; 425/544; 425/556; 425/593; 425/451.6; 425/DIG. 228
[58] Field of Search ........... 425/227, 116, 121, 126.1, 425/258, 256, 226, 228, 225, 436 R, 436 RM, 544, 556, 547, 593, DIG. 228, 139, 150, 149, 454, 592, 451.6, 451.5; 264/272.17

[56] References Cited

U.S. PATENT DOCUMENTS

| | | | |
|---|---|---|---|
| 2,054,476 | 9/1936 | Derry et al. | 425/256 |
| 2,347,972 | 5/1944 | Scott et al. | 425/436 R |
| 3,059,305 | 10/1962 | Brozdowicz | 25/103 |
| 3,801,251 | 4/1974 | Coscia | 425/229 |
| 4,079,617 | 3/1978 | Whitting | 72/404 |
| 4,360,335 | 11/1982 | West | 425/450 |
| 4,723,899 | 2/1988 | Osada | 425/116 |
| 4,755,124 | 7/1988 | Tanaka et al. | 425/593 |
| 4,812,114 | 3/1989 | Kennon et al. | 425/258 |
| 4,869,659 | 9/1989 | Sakai et al. | 425/593 |
| 4,983,115 | 1/1991 | Yamasaki et al. | 425/228 |
| 5,022,839 | 6/1991 | Brussel | 425/225 |
| 5,045,253 | 9/1991 | Kamiguchi et al. | 425/593 |
| 5,123,823 | 6/1992 | Banjo et al. | 425/116 |

FOREIGN PATENT DOCUMENTS

| | | |
|---|---|---|
| 549039 | 11/1959 | Belgium . |
| 551646 | 12/1959 | Belgium . |
| 0358770 | 7/1989 | European Pat. Off. . |
| 488318 | 12/1929 | Fed. Rep. of Germany . |
| 518347 | 2/1931 | Fed. Rep. of Germany . |
| 1080506 | 4/1960 | Fed. Rep. of Germany . |
| 1094402 | 12/1960 | Fed. Rep. of Germany . |
| 1290706 | 3/1969 | Fed. Rep. of Germany . |
| 2239310 | 3/1973 | Fed. Rep. of Germany . |
| 370199 | 1/1907 | France . |
| 1446147 | 6/1966 | France . |
| 2036655 | 12/1970 | France . |
| 2099596 | 3/1972 | France . |
| 55-87517 | 7/1980 | Japan . |
| WO89/06597 | 7/1989 | PCT Int'l Appl. . |
| 811873 | 4/1959 | United Kingdom . |
| 1292593 | 10/1972 | United Kingdom . |
| 2131736 | 6/1984 | United Kingdom . |
| 2171051 | 8/1986 | United Kingdom . |

OTHER PUBLICATIONS

George R. Smoluk, "The rush to robotics could mean a major boon to productivity," Jul. 1982, Modern Plastics International, vol. 12, No. 7, pp. 32–35.

Arnold Sternfeld, "Insert molding goes automatic," Nov. 1983, Modern Plastics International, vol. 13, No. 11, pp. 43–45.

*Primary Examiner*—Khanh Nguyen
*Attorney, Agent, or Firm*—Limbach & Limbach

[57] ABSTRACT

An apparatus for molding electronic components. The single-strip molding apparatus has a mold die formed from two mold halves which are movable relative to each other and can be closed upon one another. A leadframe for the component to be molded is placed into a recess in one of the mold halves. Molding material is heated and forced under pressure into the recess containing the leadframe. After the component is molded the mold is opened and the upper half of the mold is cleaned by a combined cleaning-discharge unit. Upon the return stroke of the cleaning-discharge unit, the molded component is removed and the lower half of the mold is cleaned.

21 Claims, 6 Drawing Sheets

SINGLE-STRIP MOLDING APPARATUS

BACKGROUND OF THE INVENTION

For the molding of electronic components, chips, molding apparatus are used wherein a so-called leadframe supporting an electronic component, such as a chip is placed into a mold wherein the mold displays recesses for receiving the parts for molding, and in addition cavities are arranged in the mold wherein measured quantities of molding material are placed and wherein by supplying heat and exerting pressure in these cavities the molding material becomes liquid, moves via channels intended for that purpose to the parts for molding and, curing there, encapsulates the leadframe. The leadframe is subsequently removed from the molding apparatus and subjected to further processing. An apparatus of this type is known for example from Patent Abstracts of Japan, vol. 4, No. 128 (M-31)(610), Sep. 9, 1980, & JP,A, 5587517 of Jul. 2, 1980.

SUMMARY OF THE INVENTION

The object of the invention is to provide a single-strip molding apparatus which combines a simple construction with a relative high production rate.

This achieved according to the invention by providing a single-strip molding apparatus comprising a mold formed by two mold halves vertically movable relative to one another and closable onto one another, means for placing a leadframe supporting an electronic component into one of the mold halves, means for carrying molding material into cavities of the mold, means for exerting pressure and supplying heat to said cavities to liquify the molding material and channels for supplying said molding material to said recesses, means for heating the mold halves, means for cleaning the mold halves and means for removing a molded product from the mold.

By combining different processes such as cleaning, which has to take place after each molding cycle, with the removal of the molded product an optimal production rate is achieved.

From U.S. Pat. No. 3,059,305 a molding apparatus is known in which a reciprocating hopper is provided that combines the function of supplying molding material and cleaning of the mold cavity. After molding the object the molding pushes the product outwardly of the mold and cleans the mold cavity. The mold press consists of two plungers pressing the molding material in the cavity.

According to a preferred embodiment the cleaning-discharge unit performs a reciprocating movement and during the outward movement the one mold half is cleaned and during the inward movement the molded product is removed and the other mold half cleaned in one operating stroke.

An optimal production rate is achieved by setting into operation the means for placing a subsequent leadframe in a mold immediately following the inward movement of the cleaning-discharge unit.

The means for exerting pressure preferably consist of at least one plunger which is driven by means of an electromotor, a screwed rod and a nut arranged on a screwed rod. Driving has taken place to date in the usual manner with hydraulic means, which however entails various drawbacks. Hydraulic driving requires cooling and is not otherwise well compatible with the clean surroundings in which the process must take place. There has further been the drawback that there was no direct proportional relation between the exerted hydraulic pressure and/or the controlled volume flow of the hydraulic oil and the displacement speed of the plunger. The pressure-raising process was difficult to control. Using the electromechanical driving a direct relation is achieved between the action of the electromotor and the displacement speed of the plunger and/or the force to be exerted by the plunger on the molding material by converting the rotation movement of the electromotor into a linear movement of the plunger rod using the nut and the screwed rod. An electromotor rod moreover does not pollute the surrounding area which befits the cleanliness required of the area wherein the process takes place. In addition the energy consumption of a hydraulic plunger drive is much greater than that of an electromechanical plunger drive. With hydraulic plunger driving cooling is therefore needed for the oil heated by friction losses. The noise level of an electromechanical driving is also considerably lower.

The mold halves are also preferably closed relative to one another by an angle lever system connected to one of the mold halves and driven by an electromotor and a screwed rod. The required closing force to be exerted on the mold halves is transmitted in a suitable manner by the angle level system since this exerts great force especially at the end of the stroke.

As first alternative embodiment the mold halves can be moved relative to one another using a control mechanism consisting of a pneumatic cylinder which effects the largest part of the stroke and a piston-cylinder unit having multiple pistons placed on the piston rod for providing by pneumatic means the final necessary closing force.

As second alternative embodiment the mold halves can be moved relative to one another using a control mechanism consisting of at least one pneumatic cylinder which effects the largest part of the stroke and a closed piston-diaphragm cylinder unit filled with liquid for converting pneumatic pressure into hydraulic pressure for providing the final necessary closing force.

With the apparatus according to the invention the mold halves perform a vertical movement relative to one another, the lower mold half is fixedly disposed, the upper half is movable and the means for cleaning, for placing the leadframe in the mold and for removing product out of the mold perform a horizontal movement and the means unified into a cleaning-discharge unit for cleaning and removal of the product from the one side and the means for placing the leadframe from the other side perform a reciprocating movement extending into the mold die. This provides the advantage that during the discharge movement of the finished product to the one side following on therefrom the input means can place a subsequent leadframe in the mold die.

The means for placing a leadframe are formed by a first carriage movable over guide rails while the cleaning-discharge unit is placed on a second carriage which is movable over the same guide rails.

The plunger increasing the pressure in a cavity is preferably under bias. It is hereby possible to raise the pressure to the required level despite the fact that the same quantity of molding material will not always be present in the relative cavity. The position of the plunger is therefore adapted by the bias to the volume of molding material in the relevant cavity. As alternative method a channel is arranged in one of the two mold halves which mutually connects the cavities into which the measured quantities of molding material are fed, with the object of equalising mutual volume-differences in these fed quantities of molding material.

The invention will be further elucidated with reference to the drawings.

DETAILED DESCRIPTION OF THE PREFERRED EMBODIMENT

Figure 1:
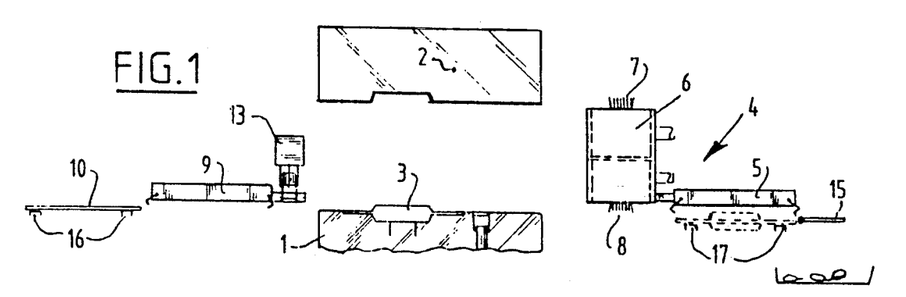
FIGS. 1-3 show schematically one complete cycle of the molding apparatus according to the invention.
Figure 2:
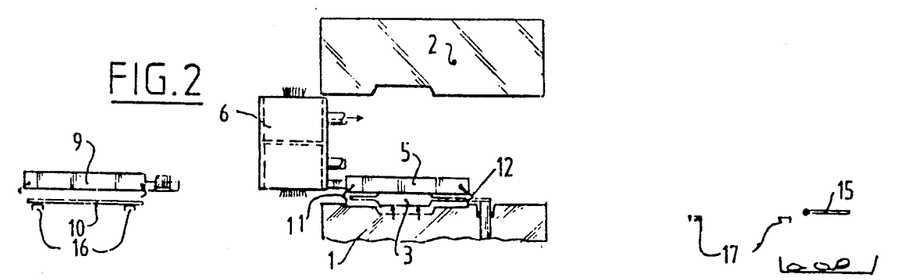

In FIG. 1 the mold, which consists of a fixedly positioned lower half and a vertically movable upper half, is open. It is assumed that the molding has been completed during the previous cycle and that the molded product 3 is still in the mold, that is, in the lower half 1. The cleaning-discharge unit 4 consists of a discharge carriage 5 and a brushing device 6 with brushes at the top 7 and brushes at the bottom 8. After opening of the mold (FIG. 1) the cleaning-discharge carriage 4 performs a movement to the left and thereby cleans the upper half of the mold (FIG. 2). The input carriage 9 likewise moves to the left to pick up a subsequent leadframe 10 from a store (not drawn) by means of a feed belt 16.

According to FIG. 2 the cleaning-discharge unit 4 then performs the return stroke wherein the discharge carriage 5 picks up the finished molded frame 3 using schematically designated hook-shaped means 11, 12 and cleans the lower half of the mold.

Figure 3:
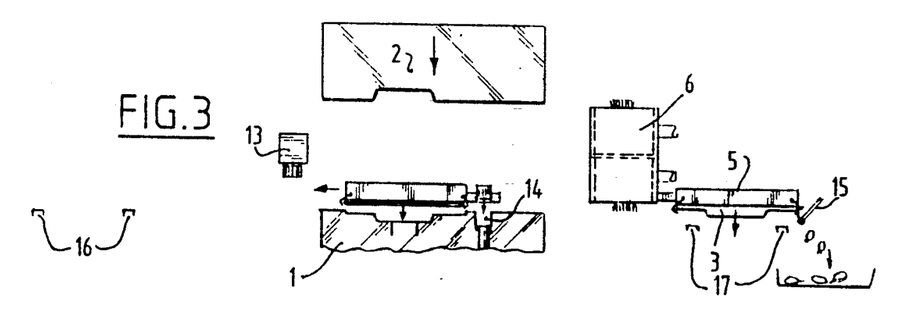

Following on from the active stroke shown in FIG. 2 the input carriage 9 places the next leadframe into the mold. During the position in FIG. 1 the input carriage is thereby filled in cavities arranged for this purpose from a so-called pellet carriage 13 with pellet-shaped portions of molding material which in the position as in FIG. 3 are placed into the cavities 14 intended for this purpose in the lower half 1 of the mold. The upper half 2 of the mold subsequently moves in the downward direction indicated with an arrow and closes (not drawn) onto the lower mold half, whereupon the molding process beings. In the position drawn in FIG. 3 remnants of the molding pellets are removed from the leadframe 3 with schematically designated means 15, after which the leadframe is discharged via a belt 17.

Figure 4:
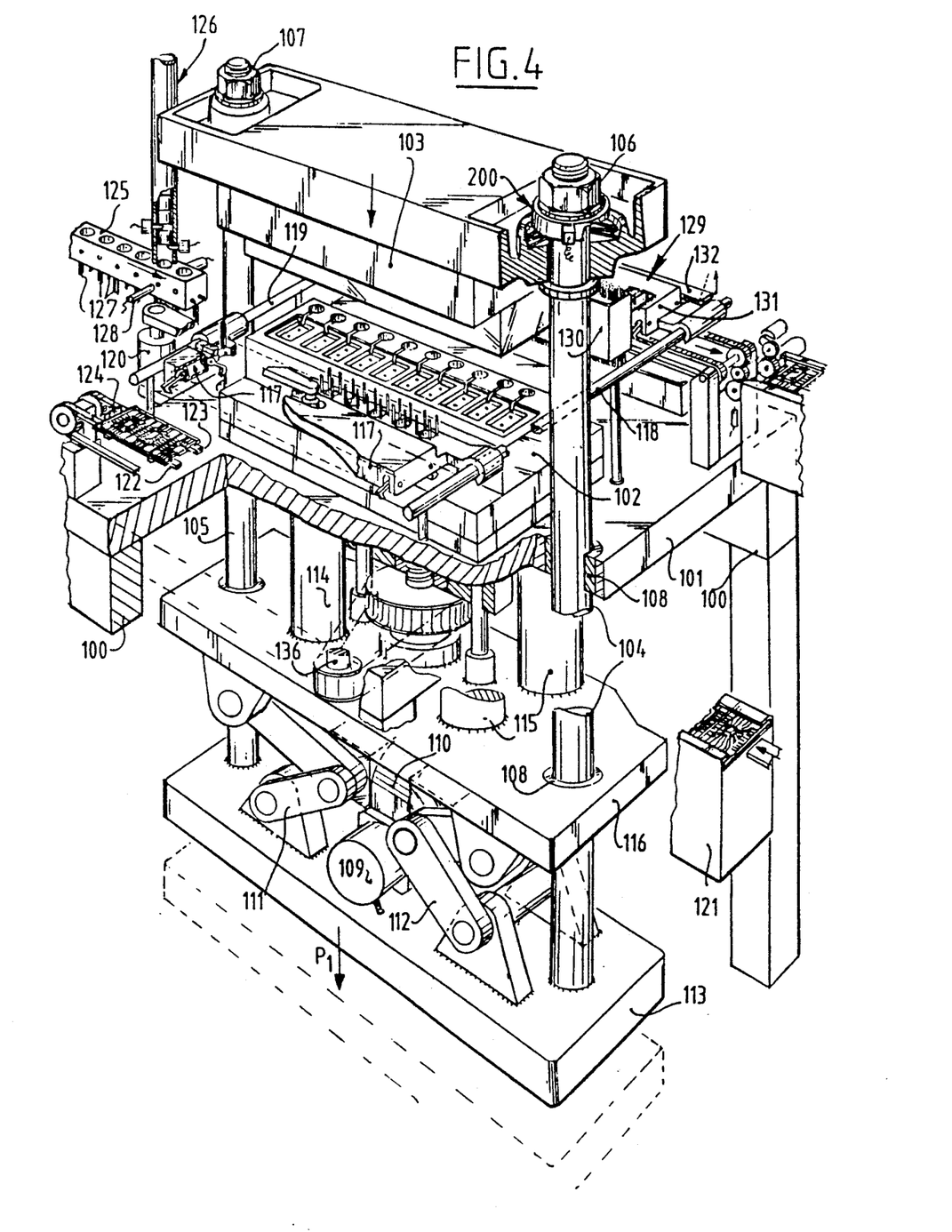
FIG. 4 shows a perspective view of the molding apparatus according to the invention.

A further more detailed description will now be given with reference to FIGS. 4 and 5.

Mounted on the frame 100 of the machine is a fixedly positioned table 101. The table 101 bears a fixed lower mold half 102. The upper mold half 103 is movable relative to the lower half 102 using pull rods 104, 105 which are connected to the upper half 103 by the respective nut connections, 106, 107. The pull rods 104, 105 are movable relative to the fixed table 101 via bearings, for example 108.

The driving of the upper half of the mold 103 takes place from an electromotor 109. Driven by means of the worm box 110 are the angle level systems 111, 112. The angle lever systems are coupled on the one side to a movable underplate 113 and on the other side to a plate 116 fixedly connected to the table 101 by means of columns 114, 115. When the electromotor rotates the underplate 113 is moved vertically, for example in the direction of the arrow P1, which movement is transmitted via the pull rods 104, 105 onto the upper mold half 103. At the end of the stroke the arms of the angle lever system 111, 112 lie practically in one line so that a very great closing force is achieved.

The input carriage 117 is movable over the guide rails 118, 119. The driving of the input carriage 117 takes place from the electromotor 120.

Leadframes are supplied from a supply cassette and are carried up over the belts 122, 123 as far as a stop 124. During the position of the input carriage outside the mold the input carriage is filled from a so-called pellet-filling carriage 125 with pellet-shaped molding material which is take from a supply reservoir 126. For a reliable take-over of pellet-shaped molding material by the input carriage 117 from the pellet transporting carriage 125 use is made in both carriages of pin-shaped guiding means 127. The mutual movements are controlled using a sensor 128.

The cleaning-discharge unit 129 is likewise movable over the rails 118, 119 between the position outside the mold die and the position inside the mold die. The unit 129 consists of a cleaning-brushing device 130 and a discharge member 131. The cleaning device 130 brushes both mold halves after use and simultaneously sucks up brushed-off remnants. Co-acting with the unit is a break-off plate 132 which subjects the finished product to an after-processing.

Figure 5:
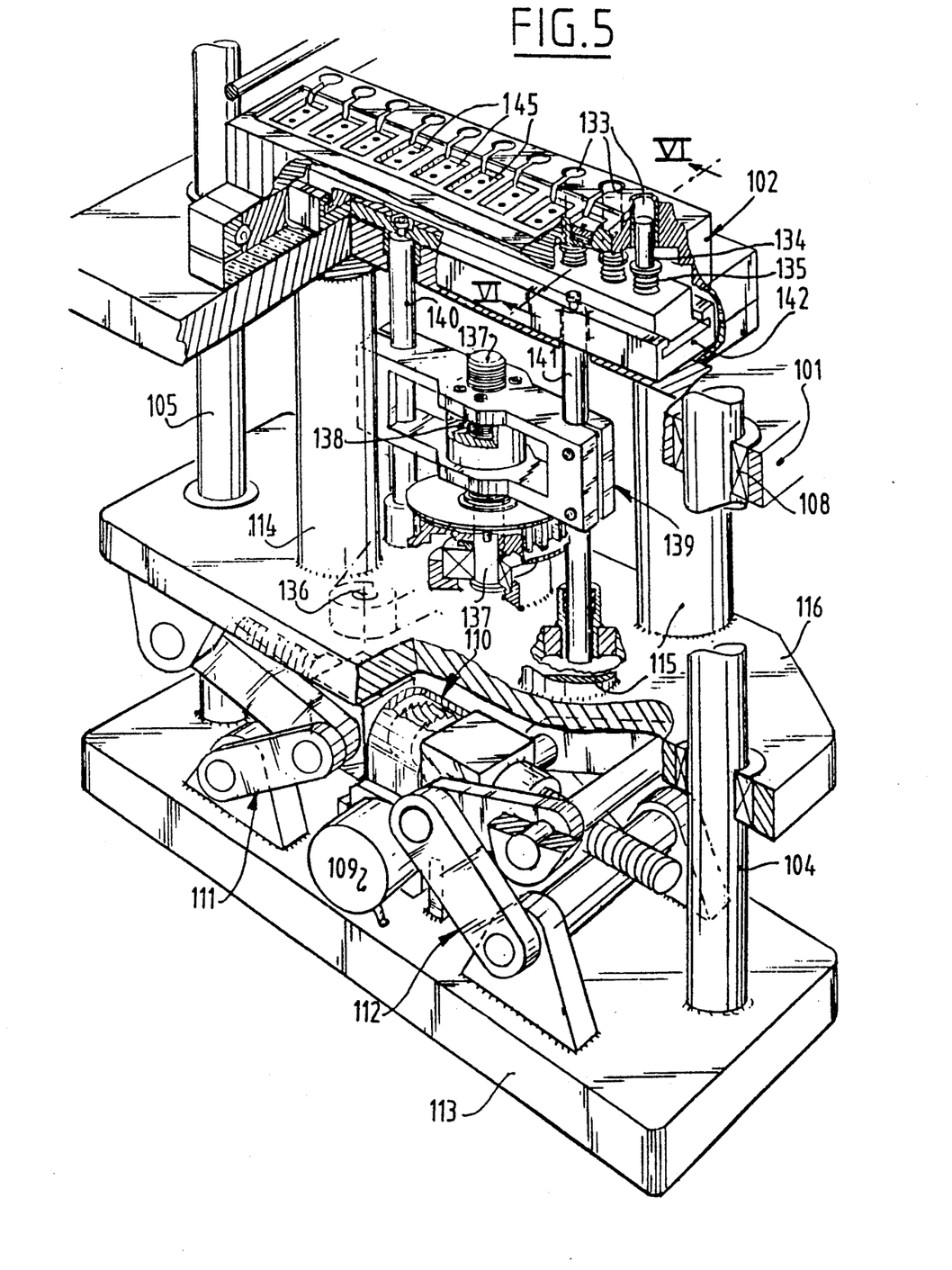
FIG. 5 shows on a larger scale a detail of the lowermost part of the molding apparatus according to FIG. 4.
Figure 6:
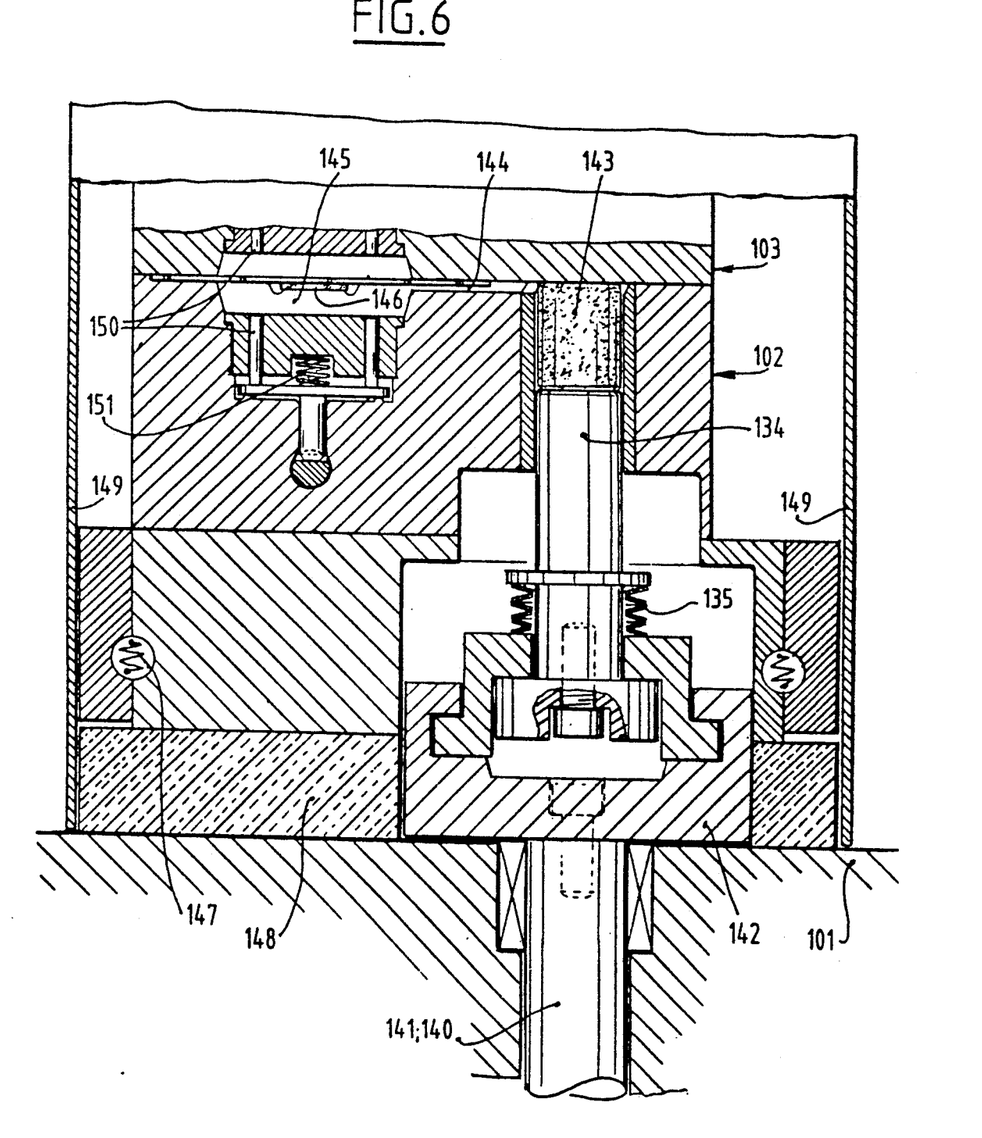
FIG. 6 shows a sectional view of the mold of the molding apparatus from FIGS. 4 and 5.

As can be seen in FIG. 5, the cavities 133 in the lower half 102 of the mold are each provided with a plunger 134 which (see also FIG. 6) is biased by a spring washer 135 such that the position of the plunger is adapted to the quantity of molding material in the relevant cavities 133. The plungers are driven from an electromotor which drives a screwed rod 137 via the speed control 136. A nut 138 is placed on the screwed rod so that the rotating movement is converted into a vertically directed movement of the frame 139. Fixedly coupled to the frame are the drive rods 140, 141 for the plunger bracket 142 which in turn drives the plungers. As can be seen from the section VI—VI in FIG. 5 shown on a larger scale in FIG. 6, the pellet-shaped molding material 143 is compressed during the ascending movement and transported via the channel 144 to the cavity 145 in the lower half of the mold where the chip 146 is arranged. As can be further seen in FIG. 6 a heating coil 147 is arranged for heating the lower half of the mold. The lower half of the mold is insulated by means of insulating material 148. Also visible in FIG. 6 is the protective cover 149.

In order to improve removal of the finished product a push-out pin 150 under bias of a spring 151 is arranged near the cavity 145.

Figure 7:
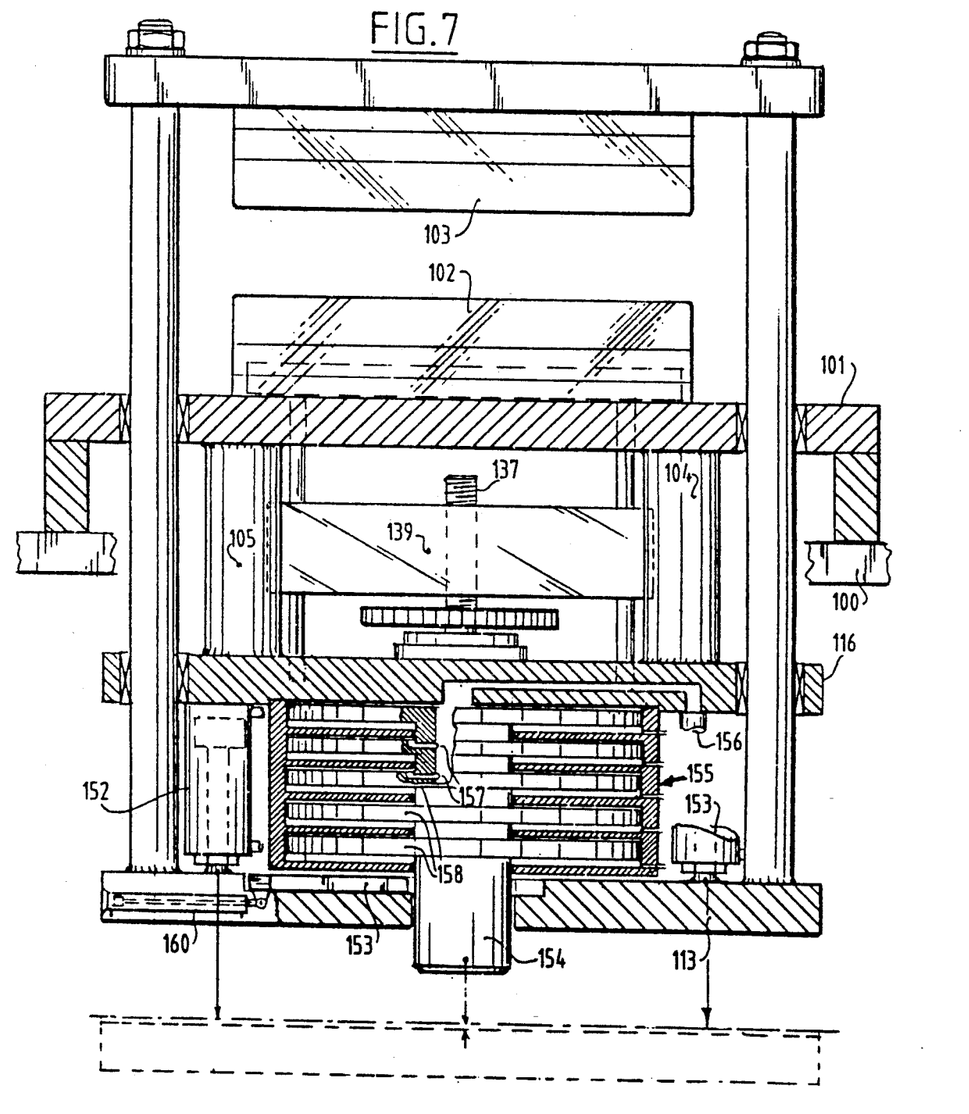
FIG. 7 shows a first alternative embodiment of the closing mechanism of the mold of the molding apparatus according to the invention.

The embodiment according to FIG. 7 shows another embodiment for displacement of the upper half of the mold and the generating of the required great closing force.

Pneumatic cylinders 152 and 153 displace the upper half of the mold via the movable underplate 113, as in the case of the first discussed embodiment. At the end of the stroke the slide 153 is pushed under the piston rod 154 so that a closed piston-plunger 155 is created. Via the channel compressed air is subsequently admitted from a source 156 (not drawn) which is distributed via the sub-channels, for example 157, over pistons, for example 158, arranged on the piston rod 154. As a result of the large suction surface obtained by the combination of the pistons 158 arranged parallel on the rod 154 a very great closing force is achieved with a small stroke. This is transmitted to the plate 113 and therefore to the upper half of the mold 103. It is further noted that the closing of the slide takes place by means of the plunger 160.

Figure 8:
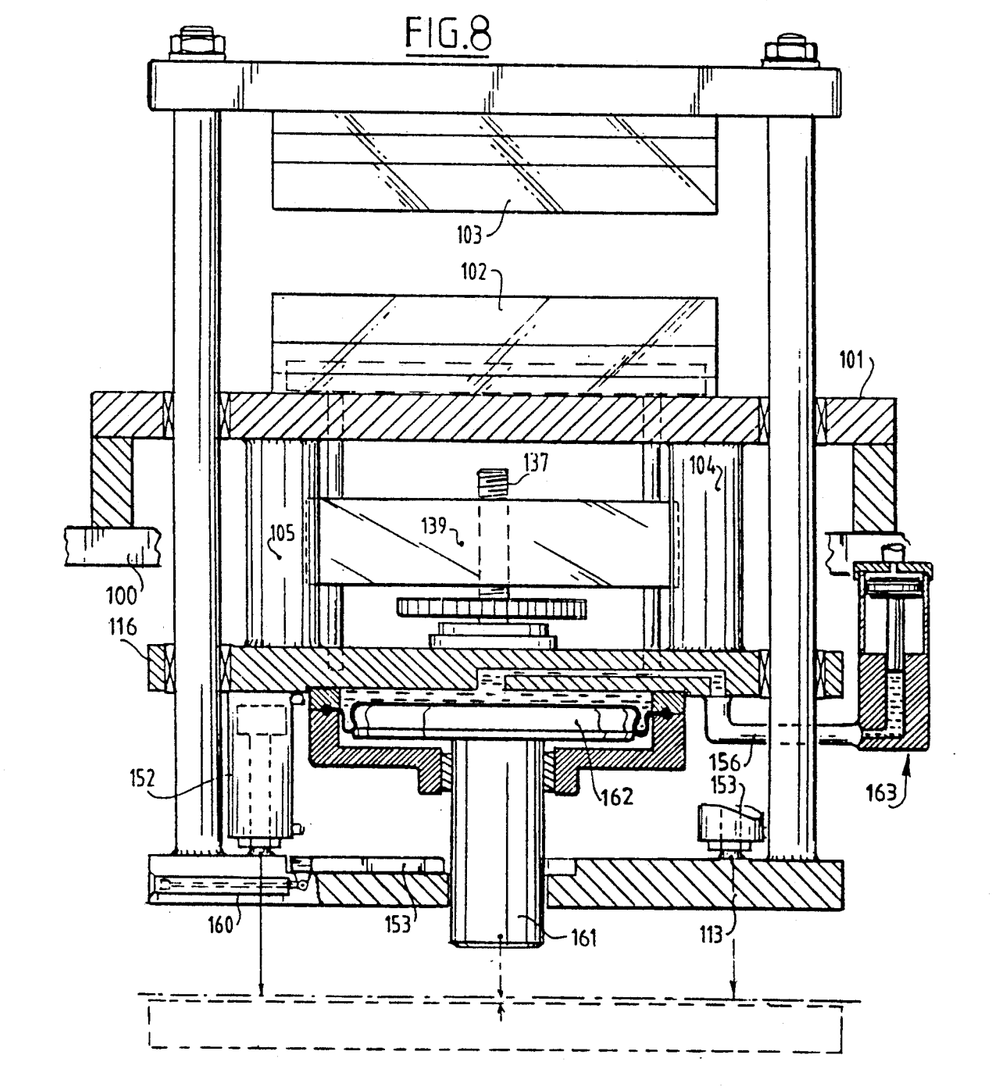
FIG. 8 shows a second alternative embodiment of the closing mechanism of the mold of the molding apparatus according to the invention.

FIG. 8 shows an alternative embodiment of the closing mechanism of the mold of the mold apparatus according to the invention.

A discussion of those parts which correspond with the embodiment according to figure 7 is omitted.

The closing force to the mold halves is provided in this case by a piston-diaphragm cylinder unit filled with liquid. The plunger 161 is moved by the pressure of the liquid exerted on the piston 162, which is derived from the control cylinder 163. This is in contact with the cylinder space of the plunger 161 via the line 156.

Preferably a device 200 for measuring the closing force of one of the halves of the molds is with respect to the other mold half is provided in the linkage for transferring the force from the electromotor to the movable mold half. Upon receiving a predetermined value of the closing force, a control signal is generated that is applied to stop the driving electromotor.

We claim:

1. A single-strip molding apparatus, comprising:
   a mold formed by an upper mold half and a lower half vertically movable relative to one another and closable onto one another;
   means for placing a leadframe supporting an electronic component into a recess in one of the mold halves;
   means for carrying molding material into a cavity of the mold;
   means for exerting pressure and supplying heat to said cavity to liquify the molding material;
   channels for supplying said liquified molding material to said recess;
   means for heating the mold halves;
   means for cleaning the mold halves; and
   means for removing a molded product from the mold, wherein the means for cleaning and for removing the molded product are unified into a cleaning-discharge unit which removes the product from one side of the mold while said means for placing the leadframe supplies said leadframe from another side of the mold, and further, wherein said cleaning discharge unit and said means for placing the leadframe perform reciprocating movements into the mold.

2. The apparatus of claim 1, wherein the cleaning-discharge unit performs a reciprocating movement which includes a forward and a backward movement and during the backward movement the upper mold half is cleaned and during the forward movement the molded product is removed from the mold and the lower mold half is cleaned.

3. The apparatus of claim 1, wherein immediately following the forward movement of the cleaning-discharge unit the means for placing a leadframe into the mold becomes operative.

4. The apparatus of claim 1 wherein the means for exerting pressure to the cavity consists of a plunger which is driven by means of an electromotor, a screwed rod and a nut arranged on the screwed rod.

5. The apparatus of claim 1, wherein the upper and lower mold halves are closed relative to one another by an angle lever system connected to the upper mold half and driven by an electromotor over a screwed rod.

6. The apparatus of claim 1, wherein the upper and lower mold halves are moved relative to one another using a control mechanism consisting of a pneumatic cylinder and a closed piston-diaphragm cylinder unit filled with liquid for providing the closing force.

7. The apparatus of claim 1, wherein the means for placing a leadframe into the mold are formed by a first carriage movable over guide rails and the cleaning-discharge unit is placed on a second carriage movable over the guide rails.

8. The apparatus of claim 1, wherein the plunger increasing the pressure in a cavity is under a bias force.

9. The apparatus of claim 1, wherein there is more than one cavity and the plungers increasing the pressure in the cavities are mutually connected by means of channels in one of the mold halves.

10. The apparatus of claim 1, further comprising:
    means for measuring the closing force of the mold halves.

11. The apparatus of claim 10, wherein said means for measuring the closing force are adapted to produce a control signal to stop the electromotor for driving said angle lever system connected to one of the mold halves when said closure force reaches a predetermined value.

12. The apparatus of claim 2, wherein immediately following the forward movement of the cleaning-discharge unit the means for placing a leadframe into the mold becomes operative.

13. The apparatus of claim 2, wherein the means for exerting pressure to the cavity consists of a plunger which is driven by means of an electromotor, a screwed rod and a nut arranged on the screwed rod.

14. The apparatus of claim 2, wherein the upper and lower mold halves are closed relative to one another by an angle lever system connected to the upper mold half and driven by an electromotor over a screwed rod.

15. The apparatus of claim 2, wherein the upper and lower mold halves are moved relative to one another using a control mechanism consisting of a pneumatic cylinder and a closed piston-diaphragm cylinder unit filled with liquid for providing the closing force.

16. The apparatus of claim 2, wherein the means for placing a leadframe into the mold are formed by a first carriage movable over guide rails and the cleaning-discharge unit is placed on a second carriage movable over the guide rails.

17. The apparatus of claim 2, wherein the plunger increasing the pressure in a cavity is under a bias force.

18. The apparatus of claim 2, wherein there is more than one cavity and the plungers increasing the pressure in the cavities are mutually connected by means of channels in one of the mold halves.

19. The apparatus of claim 2, further comprising:
    means for measuring the closing force of the mold halves.

20. The apparatus of claim 19, wherein said means for measuring the closing force are adapted to produce a control signal to stop the electromotor for driving said angle lever system connected to one of the mold halves when said closure force reaches a predetermined value.

21. An apparatus for encapsulating or molding an electronic component comprising:
- a mold having an upper first mold half and a lower second mold half, the mold halves being vertically movable relative to one another and closable onto one another, the lower mold half having a recess;
- reciprocating means for placing an electronic component into the recess of the lower mold half;
- means for providing molding material in a liquified form to the recess;
- means for curing the molding material; and
- a reciprocating cleaning-discharge unit having a forward movement into the mold and a backward movement out of the mold, the cleaning-discharge unit including means for cleaning the upper mold half and the lower mold half and means for removing the component from the mold after the molding material has been cured, wherein during the backward movement the upper mold half is cleaned and during the forward movement the molded product is removed from the mold and the lower mold half is cleaned, and further wherein the means for removing the molded component removes the component from one side of the mold while the means for placing the electronic component into the recess supplies the component from another side of the mold.

* * * * *